(12) United States Patent
Koyama

(10) Patent No.: US 8,805,147 B2
(45) Date of Patent: Aug. 12, 2014

(54) WAVEGUIDE, APPARATUS INCLUDING THE WAVEGUIDE, AND METHOD OF MANUFACTURING THE WAVEGUIDE

(75) Inventor: Yasushi Koyama, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 88 days.

(21) Appl. No.: 13/461,297

(22) Filed: May 1, 2012

(65) Prior Publication Data

US 2012/0292512 A1 Nov. 22, 2012

(30) Foreign Application Priority Data

May 17, 2011 (JP) .................................. 2011-110887

(51) Int. Cl.
*G02B 6/10* (2006.01)
(52) U.S. Cl.
USPC ............. 385/129; 385/132; 250/338.4; 372/7
(58) Field of Classification Search
CPC ....................................................... G02B 6/132
USPC ..................... 385/129, 132; 250/338.4; 372/7
See application file for complete search history.

(56) References Cited

U.S. PATENT DOCUMENTS

| | | | |
|---|---|---|---|
| 7,693,198 B2 * | 4/2010 | Sekiguchi et al. | 372/45.01 |
| 2010/0038535 A1 * | 2/2010 | Nasu et al. | 250/307 |
| 2010/0232457 A1 * | 9/2010 | Sekiguchi | 372/4 |
| 2011/0101250 A1 | 5/2011 | Hu | |
| 2012/0207186 A1 | 8/2012 | Belkin et al. | |
| 2012/0296589 A1 | 11/2012 | Koyama | |
| 2013/0063159 A1 | 3/2013 | Koyama | |

FOREIGN PATENT DOCUMENTS

| | | |
|---|---|---|
| EP | 1863140 A1 | 12/2007 |
| WO | 2008/012527 A1 | 1/2008 |
| WO | 2010/094042 A2 | 8/2010 |

OTHER PUBLICATIONS

Christian Pflügl et al., "Surface-emitting Terahertz Quantum Cascade Laser Source Based on Intracavity Difference-Frequency Generation," 93 Appl. Phys. Lett. 93, 161110 (1-3) (Oct. 2008) (XP12111955).
Extended European Search Report in European Application No. 12003433.5 (Oct. 24, 2012).
Benjamin S. Williams et al., "Terahertz Quantum-Cascade Laser at λ ≈ 100μm Using Metal Waveguide for Mode Confinement," 83(11) Appl. Phys. Lett. 2124-2126 (Sep. 2003).
Bo Li et al., "Development of a Novel GaAs Micromachined Accelerometer Based on Resonant Tunneling Diodes," 143 (2) Sensors and Actuators A: Physical 230-236 (May 2008).

(Continued)

*Primary Examiner* — Ellen Kim
(74) *Attorney, Agent, or Firm* — Fitzpatrick, Cella, Harper & Scinto

(57) ABSTRACT

Provided are a waveguide with which strain and defect caused by a manufacturing process or the like or caused in a semiconductor in an initial stage or during operation are suppressed so that improvement and stabilization of characteristics are expected, and a method of manufacturing the waveguide. A waveguide includes a first conductor layer and a second conductor layer that are composed of a negative dielectric constant medium having a negative real part of dielectric constant with respect to an electromagnetic wave in a waveguide mode, and a core layer that is in contact with and placed between the first conductor layer and the second conductor layer, and includes a semiconductor portion. The core layer including the semiconductor portion has a particular depressed and projected structure extending in an in-plane direction.

18 Claims, 7 Drawing Sheets

(56) References Cited

OTHER PUBLICATIONS

Extended European Search Report in European Application No. 13001586.0 (Aug. 20, 2013).

Communication pursuant to Article 94(3) in European Application No. 12003433.5 (Aug. 19, 2013).

Office Action in Chinese Application No. 201210148448.9 (issued Mar. 24, 2014).

* cited by examiner

FIG. 3I
FIG. 3II
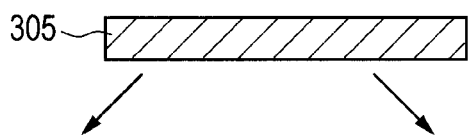
FIG. 3A3
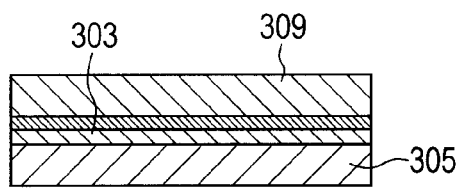
FIG. 3B3
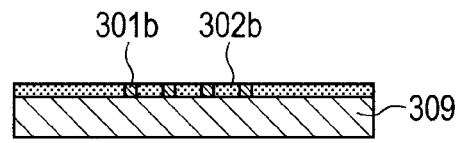
FIG. 3B4
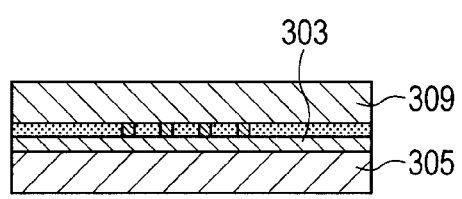
FIG. 3A4
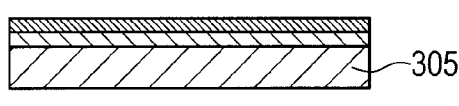
FIG. 3A5
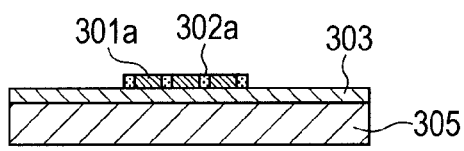
FIG. 3B5
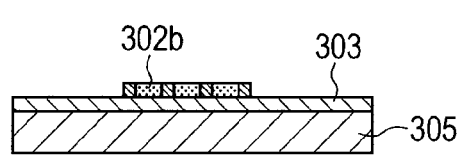
FIG. 3A6
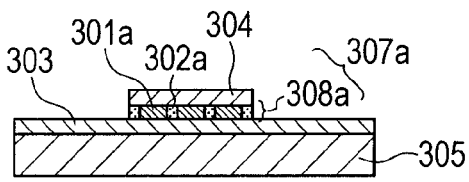
FIG. 3B6
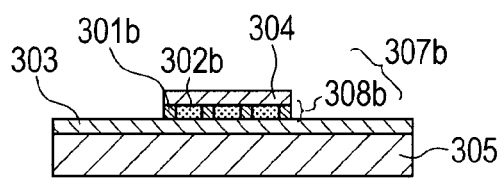

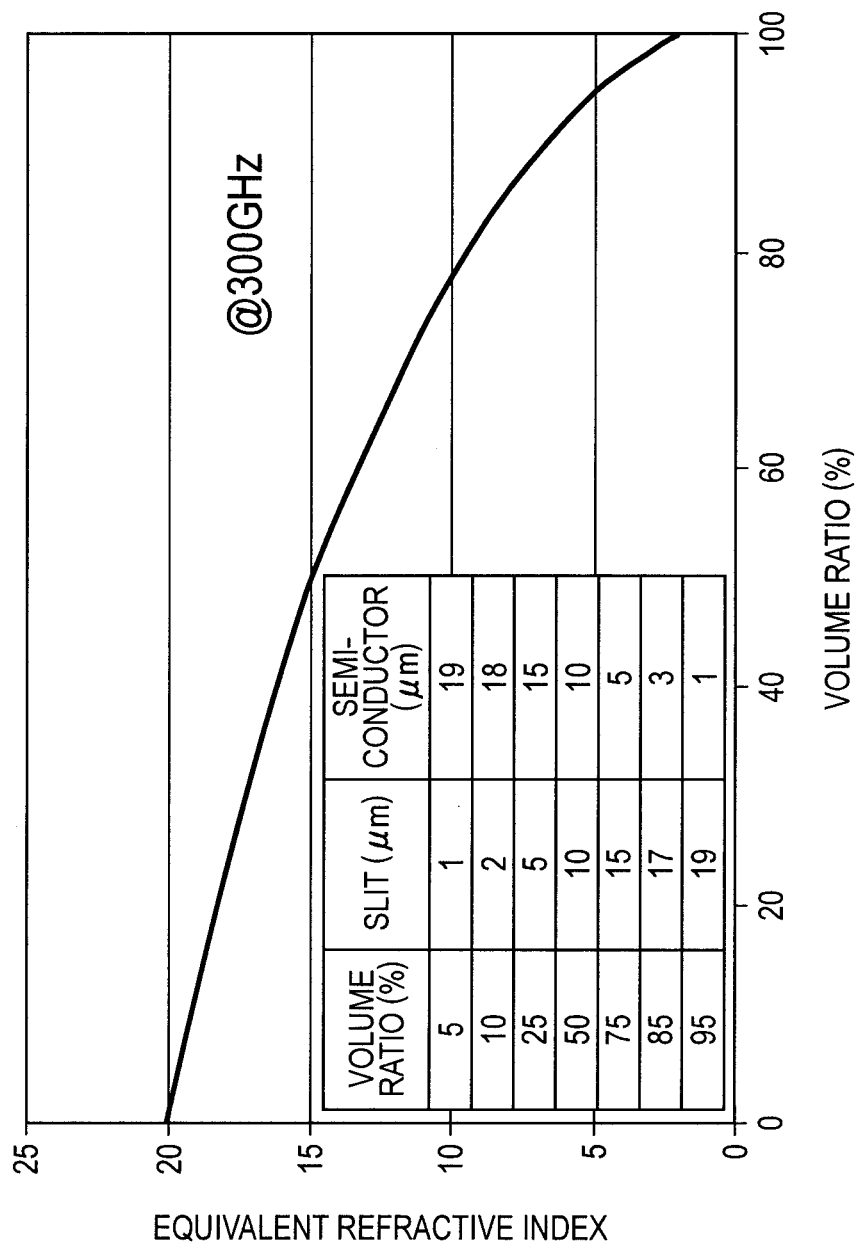

WAVEGUIDE, APPARATUS INCLUDING THE WAVEGUIDE, AND METHOD OF MANUFACTURING THE WAVEGUIDE

BACKGROUND OF THE INVENTION

1. Field of the Invention

The present invention relates to a waveguide, an apparatus including the waveguide, and a method of manufacturing the waveguide. More particularly, the present invention relates to a waveguide for electromagnetic wave in a frequency band from a millimeter wave band to a terahertz wave band (30 GHz to 30 THz) (hereinafter, also referred to as terahertz wave).

2. Description of the Related Art

In the frequency band of terahertz wave, there are absorption peaks of many organic molecules of biological materials, medicines, electronic materials, and the like stemming from the structures and states thereof. Further, terahertz wave easily penetrates materials such as paper, ceramic, a resin, and cloth. In recent years, research and development have been conducted on imaging technology and sensing technology which makes use of such characteristics of terahertz wave. For example, application thereof to a safe fluoroscopic inspection apparatus to replace an X-ray apparatus, to an in-line non-destructive inspection apparatus in a manufacturing process, and the like is expected.

As a current injection type terahertz wave light source, a structure is under study, which uses an electromagnetic wave gain based on intersubband transition of electrons in a semiconductor quantum well structure. Appl. Phys. Lett. 83, 2124 (2003) proposes a terahertz wave band quantum cascade laser (hereinafter, also referred to as QCL) in which double-side metal waveguides (hereinafter, also referred to as DMW) which are known as low loss waveguides are integrated as resonators. This element attains laser oscillation around 3 THz by excellent light confinement and low loss propagation by guiding a terahertz wave that is inductively emitted to a resonator structure in which a metal is placed above and below a gain medium formed of a semiconductor thin film of a thickness of about 10 µm in a surface plasmon mode.

On the other hand, a multiple quantum well structure is known to change the characteristics thereof owing to strain applied thereto. In Sensors and Actuators, A, 143 (2008), 230-236, a report is made that the characteristics of a resonant tunnel diode (hereinafter, also referred to as RTD) change owing to strain applied thereto. In Sensors and Actuators, A, 143 (2008), 230-236, change of about twice in negative differential resistance at a stress of near 100 MPa is observed. Further, a laser device with a waveguide as described in U.S. Pat. No. 7,693,198 is disclosed.

The DMW disclosed in Appl. Phys. Lett. 83, 2124 (2003) has a structure in which two metal layers sandwich a semiconductor layer having a thickness of about 10 µm, and the DMW is manufactured by transferring the semiconductor thin film onto a different substrate using a metal bonding technology or the like. On the other hand, a structure in which thin film materials having different lattice constants and different thermal expansion coefficients are laminated is generally known to be liable to cause a residual stress therein due to the manufacturing process. Therefore, in a conventional structure, the strain or defect due to the manufacturing process or the like may change the characteristics of the semiconductor thin film which is a gain medium to cause deterioration or instability of the oscillation characteristics.

SUMMARY OF THE INVENTION

The present invention has been made in view of the above-mentioned problem. A waveguide according to the present invention includes a first conductor layer and a second conductor layer that are composed of a negative dielectric constant medium having a negative real part of dielectric constant with respect to an electromagnetic wave in a waveguide mode, and a core layer that is in contact with and placed between the first conductor layer and the second conductor layer, and includes a semiconductor portion. The core layer including the semiconductor portion has a depressed and projected structure which extends in an in-plane direction, and besides at least one of the following requirements is satisfied:

(1) the depressed and projected structure is arranged in a direction perpendicular to a propagation direction of the electromagnetic wave in the waveguide mode, and has plural projected portions;

(2) the depressed and projected structure has a pitch length less than $\lambda_g/2$ where $\lambda_g = \lambda/n_e$, $\lambda$ is a wavelength of the electromagnetic wave, and $n_e$ is an equivalent refractive index of the waveguide; and (3) the depressed and projected structure has a pitch length less than 100 µm.

The waveguide according to the present invention has the depressed and projected structure in which the core layer including the semiconductor portion extends in the in-plane direction. Therefore, even with a laminated structure of different materials such as a first conductor layer of a negative dielectric constant medium, a core layer including a semiconductor portion, and a second conductor layer of a negative dielectric constant medium, due to the effect of alleviating strain by the minute depressed and projected structure, the strain caused by a lattice constant difference or a thermal expansion coefficient difference is alleviated.

More specifically, there are the following three cases: (1) the depressed and projected structure is arranged in the direction perpendicular to the propagation direction of the electromagnetic wave in the waveguide mode, and has multiple projected portions; (2) the depressed and projected structure may have the pitch length less than $\lambda_g/2$ where $\lambda_g = \lambda/n_e$, $\lambda$ is the wavelength of the electromagnetic wave, and $n_e$ is the equivalent refractive index of the waveguide, and; and (3) the depressed and projected structure may have the pitch length less than 100 µm.

Therefore, strain or defect due to the manufacturing process or the like and strain or defect caused in the semiconductor in an initial state or during operation are suppressed, and thus, improvement and stability of characteristics such as oscillation characteristics are expected. For example, there can be provided a semiconductor element which is easily manufactured in terms of dimensions and which operates stably in the frequency band of the terahertz wave, and a method of manufacturing the semiconductor element.

Further features of the present invention will become apparent from the following description of exemplary embodiments with reference to the attached drawings.

BRIEF DESCRIPTION OF THE DRAWINGS

FIGS. 3I, 3II, 3A3, 3A4, 3A5, 3A6, 3B3, 3B4, 3B5, and 3B6 are views illustrating an example of a method of manufacturing a waveguide according to the present invention.

FIG. 5 is a graph showing a result of analysis of structure of the element according to Example 3 of the present invention.

DESCRIPTION OF THE EMBODIMENTS

The present invention relates to a waveguide characterized in that a core layer that is in contact with and placed between two conductor layers of a negative dielectric constant medium for defining the waveguide and includes a semiconductor portion has a depressed and projected structure that extends in an in-plane direction. Further, at least one of the following requirements is satisfied: (1) the depressed and projected structure is provided so as to extend in a direction perpendicular to a propagation direction of the electromagnetic wave in the waveguide mode; (2) the depressed and projected structure has a pitch length less than $\lambda g/2$ where $\lambda g=\lambda/n_e$, $\lambda$ is a wavelength of the electromagnetic wave, and $n_e$ is an equivalent refractive index of the waveguide; and (3) the depressed and projected structure has a pitch length less than 100 μm. The depressed and projected structure may be a separating groove which passes through the core layer in a thickness direction, a blind groove obtained by digging down the core layer halfway in the thickness direction, a hollow portion provided in the core layer, or the like. When the semiconductor portion includes an active layer having an electromagnetic wave gain as described below, in view of the effect, it is preferred that the blind groove be dug so as to pass through the active layer, but, even if the blind groove stops before reaching the active layer, a certain level of effect is obtained. Further, a depressed portion which is a groove or a hollow portion may be space as it is, but may be formed as a spacer by filling the space with a dielectric or an insulator. The latter case is preferred in terms of strength, stability of the shape of the conductor layer to be placed thereon, and the like. According to the present invention, the effect of alleviating strain by the misfit dislocation at an end of the depressed and projected structure or the like is used, and thus, any kind of the depressed and projected structure may be formed in the core layer insofar as such stain alleviation may be caused. The waveguide according to the present invention may be used as a simple waveguide for electromagnetic wave, and, as described in an embodiment and examples in the following, the semiconductor portion may also have an electromagnetic wave gain portion to form an oscillator, an electromagnetic wave detecting element, an electromagnetic wave amplifying element, or the like.

A waveguide, an element including the same, and a method of manufacturing the waveguide according to an embodiment and examples of the present invention are described in the following with reference to the attached drawings.

Embodiment

Figure 1A:
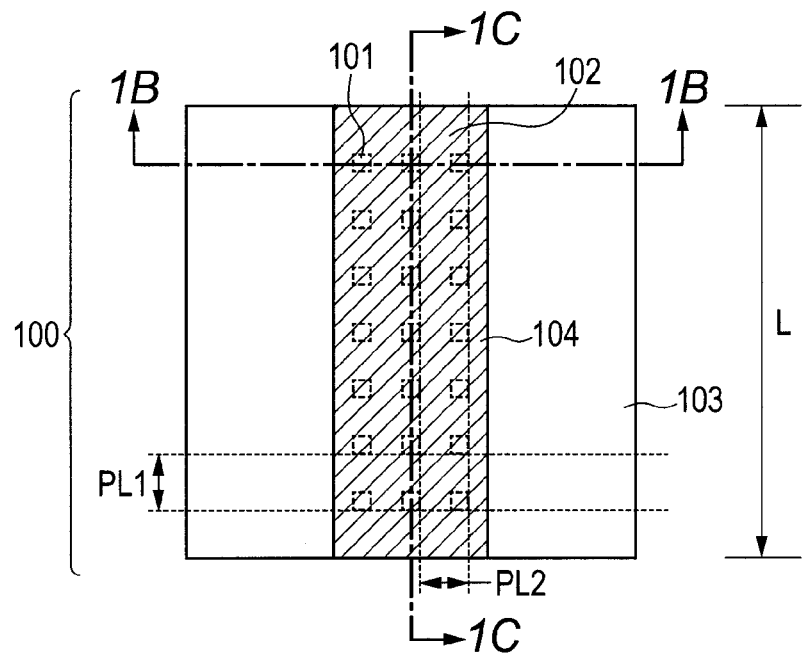
FIGS. 1A, 1B and 1C are views illustrating an element according to an embodiment and Example 1 of the present invention.
Figure 1B:
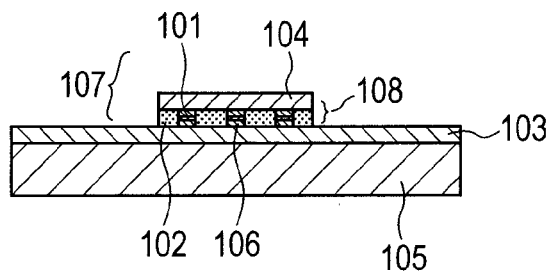
Figure 1C:
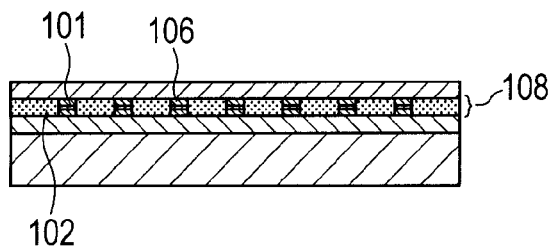

An oscillator 100 including a waveguide according to an embodiment of the present invention is described with reference to FIGS. 1A to 1C. FIG. 1A is a plan view, FIG. 1B is a sectional view taken along the line 1B-1B of FIG. 1A, and FIG. 1C is a sectional view taken along the line 1C-1C of FIG. 1A.

The oscillator 100 includes plural semiconductor portions 101 which have an electromagnetic wave gain and each of which is formed in an island shape, a spacer 102, and a first metal layer 103 and a second metal layer 104 which are conductor layers of a negative dielectric constant medium having a negative real part of dielectric constant with respect to an electromagnetic wave in a waveguide mode, and is mounted on a substrate 105. In this embodiment, an active layer 106 described below and semiconductor provided above and below the active layer 106 form the semiconductor portions 101. The semiconductor portions 101 and the spacer 102 form a core layer 108. Two metal layers 103 and 104, which are clads, and the core layer 108 form a waveguide 107 which is called a DMW. There are plural semiconductor portions 101 which are separated from one another by a separating groove that extends in the thickness direction, and each of which is formed in an island shape. It is preferred that the size of the semiconductor portions 101 be in a range of 10 μm to the order of submicrometers. In an element for a frequency band of millimeter wave to terahertz wave having such dimensions, the semiconductor portion 101 is sized so that the widths of the waveguide 107 in the longitudinal direction and in the lateral direction are equal to or smaller than $\lambda g/2$, preferably equal to or smaller than $\lambda g/10$. $\lambda g$ is the guide wavelength of the waveguide 107 in an oscillation mode, and is expressed by $\lambda g=\lambda/n_e$, where $\lambda$ is the wavelength of the electromagnetic wave, and $n_e$ is the equivalent refractive index of the waveguide 107. The two metal layers 103 and 104 are provided in proximity to each other so that the distance therebetween is, for example, $\lambda g$ or smaller.

The semiconductor portion 101 includes an active layer 106 having a multiple quantum well structure for generating terahertz wave by intersubband transition of a carrier, and has an electromagnetic wave gain. As the active layer 106, for example, a resonant tunnel structure or a quantum cascade laser structure having a semiconductor multilayer structure of several hundreds to several thousands of layers is suitable. This embodiment is described as a case in which a resonant tunnel diode (RTD) is used as the active layer 106. An RTD has an electromagnetic wave gain in the frequency band of millimeter wave to terahertz wave based on the photon-assisted tunneling phenomenon in the negative differential resistance region. It is preferred that the semiconductor portions 101 include heavily doped layers above and below the active layer 106 as an emitter/a collector for injecting current into the RTD. The semiconductor portions 101 which have an electromagnetic wave gain and include the active layer 106 are in contact with and placed between the two metal layers 103 and 104.

In particular, this embodiment is characterized by the depressed and projected structure. More specifically, it is characterized by the following three features: (1) the depressed and projected structure is arranged in a direction perpendicular to the propagation direction of the electromagnetic wave in the waveguide mode, and has plural projected portions; (2) the pitch length of the depressed and projected structure is less than $\lambda g/2$ where $\lambda g=\lambda/n_e$, $\lambda$ is the wavelength of the electromagnetic wave, and $n_e$ is the equivalent refractive index of the waveguide; and (3) the pitch length of the depressed and projected structure is less than 100 μm. By providing such a structure, the depressed and projected structure may be regarded as a structure in which an influence of reflection, scattering, refraction, and the like on the electromagnetic wave in the waveguide mode is negligible.

The spacer 102 for causing the core layer 108 to have the depressed and projected structure extending in the in-plane direction is arranged between adjacent semiconductor portions 101 so as to be in contact with the semiconductor portions 101. In the in-plane direction, the semiconductor portions 101 form projected portions of the depressed and projected structure, while the spacer 102 forms depressed portions of the depressed and projected structure. As the spacer 102, a material such as a dielectric or an insulator which is different from the material of the semiconductor portion 101 is suitable, and a low loss material with respect to an electromagnetic wave to be oscillated is preferred. The material of the spacer 102 may be a material having a lattice constant which is different from that of the semiconductor portions 101, a polycrystalline material, or an amorphous material. It is preferred to employ such a material that the semiconductor portions 101 are each formed in an island shape, that is, a discontinuous film is formed. With regard to the size of the spacer 102, it is preferred that the widths of the spacer 102 in the longitudinal direction and in the lateral direction of the waveguide 107 be equal to or smaller than $\lambda g/2$, more preferably equal to or smaller than $\lambda g/10$. The reason is that a structure sized to be 1/10 of the wavelength can be generally regarded as a structure in which influence of reflection, scattering, refraction, and the like on the electromagnetic wave in the wavelength is negligible.

As described above, the second metal layer 104 and the first metal layer 103 are placed above and below the semiconductor portion 101 and the spacer 102, respectively. The semiconductor portion 101 is mechanically and electrically in contact with the first metal layer 103 and the second metal layer 104. This allows the RTD which is the active layer 106 to be driven by voltage applied between the first metal layer 103 and the second metal layer 104. Further, it is preferred that the spacer 102 be at least mechanically in contact with the metal layers 103 and 104. The spacer 102 plays a role in fixing the distance between the first metal layer 103 and the second metal layer 104 which are in proximity to each other, and make the waveguide 107 a rigid and stable structure.

As described above, the oscillator 100 according to this embodiment includes the waveguide 107 which is a DMW. The waveguide 107 includes the core layer 108, which includes the semiconductor portions 101 having an electromagnetic wave gain, and the clads which are constituted of the first metal layer 103 and the second metal layer 104 in proximity to each other. The distance between the first metal layer 103 and the second metal layer 104 is as small as $\lambda g/2$ or smaller, preferably as small as $\lambda g/10$ or smaller, where $\lambda g$ is the guide wavelength of the oscillator 100 in the oscillation mode. Here, an electromagnetic wave in a frequency band of millimeter wave to terahertz wave propagates through the waveguide 107 in a surface plasmon mode in which no diffraction limit exists. In order to obtain the oscillation mode in which the guide wavelength is $\lambda g$, as is known in the field of the semiconductor laser technology, a length L in the longitudinal direction of the waveguide 107 which is a propagation direction of the electromagnetic wave is set to be an integral multiple of $\lambda g/2$.

The oscillator according to this embodiment has the waveguide 107 as described above. A structure formed by laminating thin film materials having different lattice constants and different thermal expansion coefficients, such as metal/semiconductor portion/metal, may cause strain due to the manufacturing process or the like in the semiconductor portion. Generally, an internal stress caused in a thin film by thermal hysteresis or the like of a process of forming a semiconductor film or a process of manufacturing an element is approximately in a range of ±1 GPa. Strain of ±0.1% to +1% may be caused in the semiconductor portions 101 or the active layer 106 due to the process, where '+' indicates a tensile stress while '−' indicates a compressive stress. Further, when a DMW structure is manufactured by bonding different kinds of substrates as in a conventional case, a thermal stress due to a thermal expansion coefficient difference or a stress concentration around a bonded interface may cause strain in the semiconductor portion.

On the other hand, the element of the present invention includes the semiconductor portions 101 which are sized so that the width thereof in a width direction of the waveguide 107 is equal to or smaller than $\lambda g/2$ to $\lambda g/10$ (10 μm to submicrometer in the frequency band of the terahertz wave), each of which is formed in an island shape, and which include the active layer 106, and the spacer 102 arranged thereamong. In this way, by forming the semiconductor portion as a gain medium not as a conventional continuous film but as a structure of an island shape sized to be as minute as the wavelength or smaller, the effect of alleviating stain by the misfit dislocation at an end of the island structure may alleviate strain caused in the semiconductor portions. In the element of this embodiment, the guide wavelength $\lambda g$ in the oscillation mode in the frequency band of the terahertz wave determines the thickness and the width of the semiconductor portions to be several tens of micrometers to 0.1 μm and several tens of micrometers to 0.1 μm, respectively, which are suitable for a structure for alleviating stain.

Further, in the element according to this embodiment, by arranging the spacer 102 of a dielectric or an insulator between adjacent semiconductor portions 101, the DMW structure is caused to be more stable. By using as the spacer 102 a low loss material with respect to millimeter wave to terahertz wave, waveguide loss due to free electron absorption, conductor loss, or the like is reduced. Further, in order to efficiently amplify standing wave in the waveguide 107, it is desirable that the semiconductor portions 101 including the active layer 106 as a gain medium be arranged at least at locations which are to be antinodes in a resonance electric field in the oscillation mode. The spacer 102 which does not contribute to amplification of an electromagnetic wave gain may be arranged at locations which are to be nodes in the resonance electric field.

An example of a method of manufacturing the waveguide is now described with reference to FIGS. 3I, 3II, 3A3 to 3A6, and 3B3 to 3B6. This manufacturing method includes the steps of forming a depressed portion in the semiconductor layer; and filling the depressed portion with a substance to provide a spacer. More specifically, by manufacturing the element described in this embodiment and a waveguide 307 which is a resonator of the element by the following steps, strain or defect caused in the semiconductor in an initial state or during operation due to the manufacturing process or the like can be reduced. The waveguide 307 includes clads which are formed of a first conductor layer 303 and a second conductor layer 304 in proximity to each other so that the distance therebetween is equal to or smaller than the guide wavelength $\lambda g$, and a core layer 308 placed between the conductor layers 303 and 304. The core layer 308 includes plural semiconductor portions 301 each formed in an island shape and a spacer 302. The waveguide 307 is manufactured in a process including the following steps (A) to (F):

(A) a step of preparing a first substrate 309 having a semiconductor portion 301 on an upper surface thereof;

(B) a step of preparing a second substrate 305;

(C) a step of transferring the semiconductor portion 301 on a first substrate 309 via a first conductor layer 303 onto an upper surface of the second substrate 305;

(D) a step of dividing the semiconductor portion 301 into an island shape;

(E) arranging a spacer 302 among divided semiconductor portions 301 each of which is formed in an island shape; and (F) a step of forming a second conductor layer 304 on an upper surface of the semiconductor layer 301.

Figure 4A:
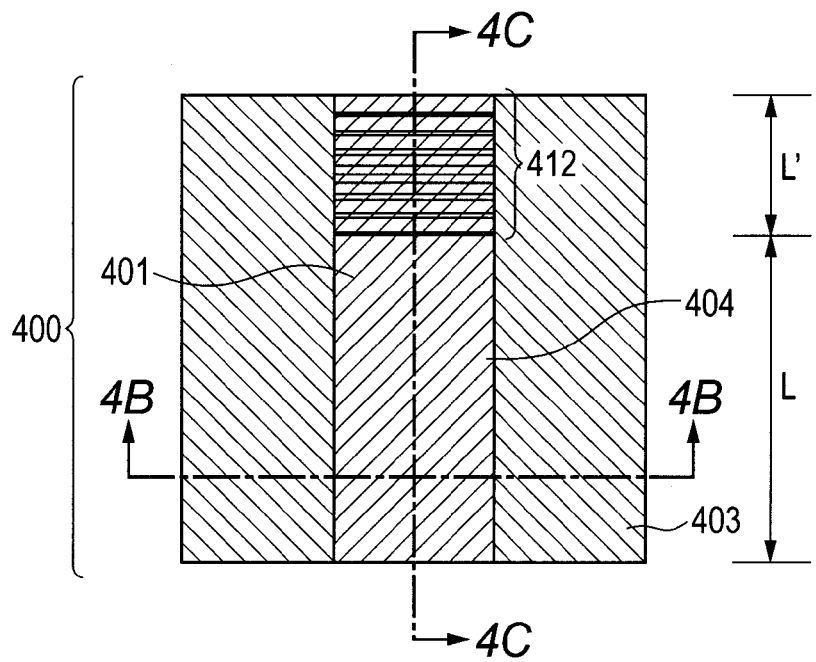
FIGS. 4A, 4B and 4C are views illustrating an element according to Example 3 of the present invention.
Figure 4B:
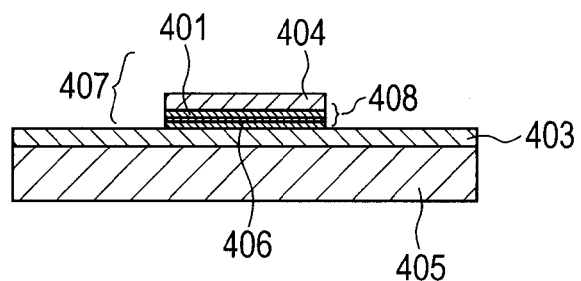
Figure 4C:
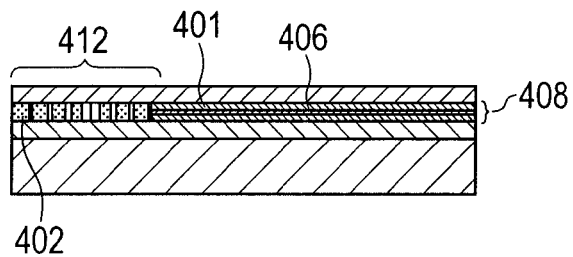

With regard to the relation with FIGS. 3I, 3II, and 3A3 to 3A6, FIG. 3I corresponds to the step (A), FIG. 3II corresponds to the step (B), FIGS. 3A3 and 3A4 correspond to the step (C), FIG. 3A5 corresponds to the steps (D) and (E), and FIG. 3A6 corresponds to the step (F).

The steps (A) to (F) are not necessarily required to be carried out in this order (FIGS. 3I, 3II, and 3A3 to 3A6). For example, as illustrated on the right side of FIG. 3 (FIGS. 3B3 to 3B6), even if the steps are carried out in the order of (A), (B), (D), (E), (C), and (F), a stress caused in transfer may be reduced, and the effect of reducing strain is expected. Further, when the semiconductor portion 301 includes an active layer having an electromagnetic wave gain, the oscillator 100 including the waveguide 307 as a resonator is manufactured. If the manufacturing method includes the steps (D) and (E), strain may be suppressed in a structure in which strain of the semiconductor may be caused in an initial state or during operation. If both the first conductor layer 303 and the second conductor layer 304 are formed of a metal, a double plasmon waveguide which carries out low loss propagation and highly efficient confinement is realized. If the second conductor layer 304 is formed of a semiconductor, a low loss single plasmon waveguide can be realized.

As described above, in this embodiment, even with a laminated structure of metal (conductor layer)/semiconductor portion/metal (conductor layer) which is a material including different kinds of thin films, an element in which strain and defect caused in the semiconductor due to the manufacturing process or the like are suppressed, and a method of manufacturing the element are provided. Therefore, according to this embodiment, an oscillator or the like which operates stably in the frequency band of the terahertz wave is realized.

More specific examples are described in the following.

Example 1

An element according to specific Example 1 of the present invention is now described with reference to FIGS. 1A to 1C, and FIGS. 3I, 3II, 3A3 to 3A6, and 3B3 to 3B6. In Example 1, as the active layer 106 having the multiple quantum well structure for generating terahertz wave by intersubband transition, an InGaAs/InAlAs-based resonant tunnel diode structure which is in lattice matching with an InP substrate was used. The active layer 106 has a semiconductor multilayer structure in which n-InGaAs (50 nm, $1\times10^{18}$ cm$^{-3}$), InGaAs (5 nm), AlAs (1.3 nm), InGaAs (7.6 nm, *), InAlAs (2.6 nm), InGaAs (5.6 nm, *), AlAs (1.3 nm), InGaAs (5 nm), and n-InGaAs (50 nm, $1\times10^{18}$ cm$^{-3}$) are laminated in the stated order from the top. The InGaAs layers with the asterisk (*) after the thicknesses thereof are to be quantum well layers, while InAlAs-based materials without the asterisk (*) are to be potential barrier layers to form a triple barrier resonant tunnel structure. The AlAs layers which are not in lattice matching with the InP substrate are thinner than a critical thin film and are high energy barriers. Further, the n-InGaAs layers at the top and at the bottom which are doped with a high density carrier are emitter/collector layers for injecting/extracting electrons into/from the resonant tunnel structure. The InGaAs (5 nm) layers placed between the emitter/collector layers and the potential barrier layers are layers for preventing diffusion of Si as a doping material.

The semiconductor portion 101 includes the above-mentioned active layer 106 and the n-InGaAs layers (500 nm, $1\times10^{19}$ cm$^{-3}$) which are placed above and below the active layer 106 and which are doped with the high density carrier.

The doping layers connect the semiconductor portion 101 and the first metal layer 103 and the second metal layer 104 placed above and below the semiconductor portion 101, respectively, with relatively low resistance. Each of the first metal layer 103 and the second metal layer 104 includes a Ti/Pd/Au laminated film. The oscillator 100 is connected via the first metal layer 103 and the second metal layer 104 to a power supply, and a bias voltage for driving is supplied thereto. With the structure described above, the oscillator 100 generates electromagnetic wave in the frequency band of millimeter wave to terahertz wave based on the photon-assisted tunneling phenomenon in the negative differential resistance region.

The waveguide 107 has a Fabry-Perot resonator structure, and includes at least two end faces in the propagation direction of the electromagnetic wave, and the electromagnetic wave is caused to be standing wave using reflection from the end faces. Thus, the length L in the propagation direction of the waveguide 107 (longitudinal direction of the waveguide 107) is a factor in determining the oscillation wavelength. In this example, the length L of the waveguide 107 is 1 mm, which is 5 times as large as λg, and the width of the waveguide 107 is 0.02 mm. Therefore, the second metal layer 104 is in a rectangular pattern of 1 mm×0.02 mm.

The semiconductor portions 101, which are each formed in an island shape so as to be separated from one another, include the depressed and projected structure extending in a direction perpendicular to the propagation direction of the electromagnetic wave in the waveguide mode. Each of the semiconductor portions is in a square shape having a width of 2 μm, and nine semiconductor portions 101 are arranged in the longitudinal direction of the waveguide 107 with the pitch length being 100 μm (λg/2), and three semiconductor portions 101 are arranged in the lateral direction of the waveguide 107 with the pitch length being 5 μm. In this way, the depressed and projected structure is provided so as to extend in the lateral direction perpendicular to the propagation direction of the electromagnetic wave in the waveguide mode. Note that, in FIGS. 1A to 1C, the pitch length is the sum of the length of a depressed portion and the length of a projected portion. The pitch length in parallel with the propagation direction of the electromagnetic wave in the waveguide mode is represented by PL1, and the pitch length in the in-plane direction and in a direction perpendicular to the propagation direction is represented by PL2. The number of the semiconductor portions 101 is reduced for the sake of easy understanding of the characteristics of the structure. The semiconductor portions 101 are arranged at locations which are to be antinodes in the resonance electric field in the oscillation mode of the waveguide 107. In this example, the end faces of the waveguide 107 are open ends, and at least a location of λg/2 from an end face is the location of an antinode in the resonance electric field. Further, as the spacer 102, BCB (benzocyclobutene) which is low loss in the terahertz wave band is arranged between adjacent semiconductor portions 101 so as to be in contact with the semiconductor portions 101. By using as the spacer 102 a low loss material with respect to millimeter wave to terahertz wave, waveguide loss due to free electron absorption, conductor loss, or the like is reduced. The distance between the first metal layer 103 and the second metal layer 104 was, as is seen from the thickness of the semiconductor portion 101, about 1 μm, and the spacer 102 is set to have the same thickness. In this example, more than 90% of the core layer 108 of the waveguide 107 is BCB which is the spacer 102, and thus, if the equivalent refractive index when the oscillation frequency is 1 THz is about 1.5, then the guide wavelength λg in the oscillation mode is 200 μm. Therefore, the size of the semiconductor portions 101 is approximately equivalent to λg/100, the pitch length is equivalent to λg/2, and the size of the spacer 102 is approximately equivalent to λg/2. Note that, when the proportion of the semiconductor portions 101 in the core layer 108 of the waveguide 107 is high, as described in Example 2 below, the equivalent refractive index increases, and, when the proportion is the half, it is intermediate between those in Example 1 and Example 2.

A method of manufacturing a waveguide 307a of the element of this example is now described with reference to FIGS. 3I, 3II, and 3A3 to 3A6. As a first substrate, an InP substrate 309 having a multiple quantum well structure which forms a semiconductor portion 301 epitaxially grown thereon is prepared (FIG. 3I). As a second substrate, a GaAs substrate 305 is prepared (FIG. 3II). A Ti/Pd/Au layer (20 nm/20 nm/200 nm) is formed on the upper surface of the InP substrate 309 (surface having the semiconductor portion 301 placed thereon) by vacuum deposition. A Ti/Pd/Au layer (20 nm/20 nm/200 nm) is formed on the upper surface of the GaAs substrate 305 by vacuum deposition. The upper surfaces of the InP substrate 309 and the GaAs substrate 305 are caused to face each other, and the two substrates are bonded to each other by thermocompression bonding of Au (FIG. 3A3). The Ti/Pd/Au/Pd/Ti layer (20 nm/20 nm/400 nm/20 nm/20 nm) formed here by thermocompression bonding is a first metal layer 303. The InP substrate 309 is removed from the integral substrate by grinding and hydrochloric acid etching to transfer the semiconductor portion 301 onto the GaAs substrate 305 (FIG. 3A4). The semiconductor portion 301 is divided into semiconductor portions 301a, each of which is formed in an island shape, by photolithography and dry etching. BCB is filled into the space between adjacent semiconductor portions 301a by spin coating and dry etching to form a spacer 302a. In this way, a core layer 308a is formed (FIG. 3A5). Vacuum deposition and lift-off are used to form a second metal layer 304 of Ti/Pd/Au (20 nm/20 nm/200 nm) (FIG. 3A6).

In the element of this example, even with a laminated structure of metal/semiconductor/metal which is a material including different kinds of thin films, strain caused by a lattice constant difference or a thermal expansion coefficient difference is alleviated. Therefore, strain or defect caused in the semiconductor in an initial state or during operation due to the manufacturing process or the like is suppressed, and thus, improvement and stability of characteristics such as oscillation characteristics are realized. Here, by providing the spacer 102, the waveguide is caused to be a plasmon waveguide having a rigid structure, and a more stable element is realized. Further, the semiconductor portions 101 having an electromagnetic wave gain are arranged at least at locations which are to be antinodes in the oscillation mode of the waveguide and the spacer 102 of a low loss material with respect to terahertz wave are arranged at locations which are to be nodes in the oscillation mode, and thus, a low loss and highly efficient plasmon waveguide is realized. Further, in the semiconductor element according to the present invention, the semiconductor portions 101 through which current is caused to flow are formed of a discontinuous film such as a depressed and projected structure or a structure in an island shape. Therefore, the area of the semiconductor is reduced compared with that in a conventional case, and thus, current which is caused to flow through the element is suppressed. More specifically, in this example, the resistance of the element approximately calculated based on the structure and the area of the semiconductor layer is about 10Ω, which is 100 times as high as that of a conventional case, i.e., about 0.1Ω. Therefore, current which is caused to flow through the entire system including the element, a peripheral circuit, and an external power supply can be reduced, and thus, influence of a parasitic component of a minute resistor, capacitor, or the like is reduced, with a result that an improvement in yield of the oscillator is expected. Further, if high current is not necessary, ordinary electronic components and apparatus may be used as the power supply and the peripheral circuit, and thus, more practical effects such as cost reduction are expected.

The present invention is not limited to the above-mentioned structure of this example, and modified examples described below are also possible. For example, in this example, the active layer 106 described above is a triple barrier resonant tunnel diode formed of InGaAs/InAlAs or InGaAs/AlAs grown on an InP substrate. However, the present invention is not limited to such structure and materials, and other structures and other combinations of materials may also provide a semiconductor element. For example, a resonant tunnel diode having a double barrier quantum well structure, a resonant tunnel diode having a multiple barrier quantum well structure of quadruple or more, a multiple quantum well structure having cascade connections as is known by a quantum cascade laser, or the like may also be used. With regard to the combination of materials, GaAs/AlGaAs, GaAs/AlAs, or InGaAs/GaAs/AlAs formed on a GaAs substrate, InGaAs/AlGaAsSb formed on an InP substrate, InAs/AlAsSb or InAs/AlSb formed on an InAs substrate, SiGe/SiGe formed on a Si substrate, or the like may also be used. The structure and the materials may be appropriately selected depending on the desired frequency and the like.

Further, in this example, the description is made on the assumption that the carrier is electrons. However, the present invention is not limited thereto, and positive holes (holes) may also be used. Further, the material of the substrate may be selected depending on the application purpose, and a semiconductor substrate such as a silicon substrate, a gallium arsenide substrate, an indium arsenide substrate, or a gallium phosphorus substrate, a glass substrate, a ceramic substrate, a resin substrate, or the like may also be used. Further, as the first metal layer 103 and the second metal layer 104, a metal (λg, Au, Cu, Al, a AuIn alloy, or the like) or a semimetal (Bi, Sb, ITO, ErAs, or the like) may be suitably used. It is to be understood that a heavily doped semiconductor may be used as the conductor. Further, as the spacer 102, an inorganic material such as $SiO_2$, TEOS, polysilicon, $SiN_x$, AlN, or $TiO_2$ or an organic material such as BCB, SU-8, or a polyimide is suitably used. Further, a low conductive intrinsic semiconductor which is regrown may also be used. Those modified examples are similarly applicable to other embodiments and examples.

Example 2

An element according to Example 2 of the present invention is now described with reference to FIGS. 2A to 2C and FIGS. 3I, 3II, 3A3 to 3A6, and 3B3 to 3B6. As an active layer 206, a resonant tunnel diode structure which is the same as that in the case of Example 1 is used, and the structure of semiconductor portions 201 is also the same as that in the case of Example 1. With regard to a waveguide 207, also, similarly to the case of Example 1, the length L is 1 mm which is 20 times as large as λg and the width is 0.05 mm, and a second metal layer 204 is formed in a rectangular pattern of 1 mm×0.05 mm. Description of other structures which are similar to those in the case of Example 1 is omitted.

Figure 2A:
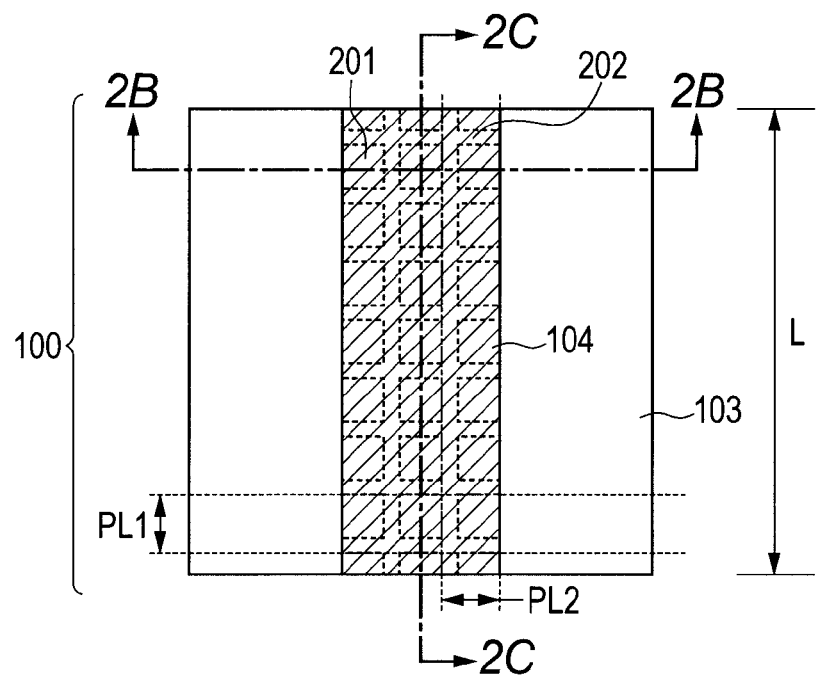
FIGS. 2A, 2B and 2C are views illustrating an element according to Example 2 of the present invention.
Figure 2B:
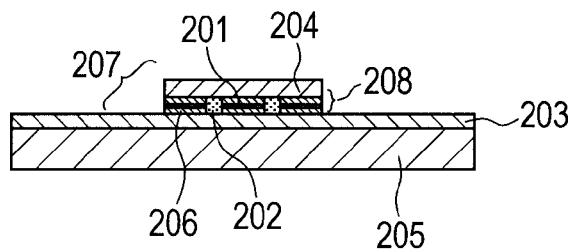
Figure 2C:
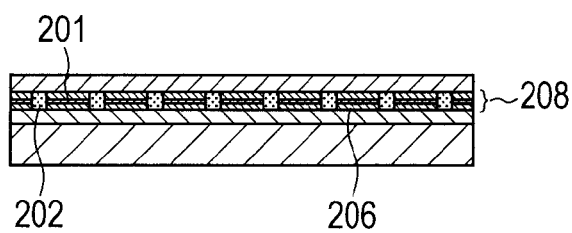

The semiconductor portions 201 each formed in an island shape in this example are each in a square shape having a width of 24 µm, and are arranged in the longitudinal direction and in the lateral direction of the waveguide 207 from an end of the waveguide 207 with the respective pitch lengths being 25 µm (λg/8). In FIGS. 2A to 2C, the pitch length is the sum of the length of a depressed portion and the length of a projected portion to be one period (one pitch length). The pitch length in parallel with the propagation direction of the electromagnetic wave in the waveguide mode is represented by PL1, and the pitch length in a direction perpendicular to the propagation direction within the plane is represented by PL2. The number of the semiconductor portions 201 is reduced for the sake of easy understanding of the structure. A spacer 202 having a width of 1 µm is arranged between adjacent semiconductor portions 201 at a location which is to be a node in the resonance electric field in the oscillation mode of the waveguide 207, and such spacer 202 is arranged in lines. In this example, the end faces of the waveguide 207 are open ends, and at least a location of λg/4 from an end face is the location of a node in the resonance electric field. By arranging the spacer 202 which is not a gain medium at locations which are to be nodes in the electric field which do not contribute to amplification, lowering of the gain of the oscillator is prevented more compared with a case of a structure having the semiconductor portions 201 at the locations. In this example, as the spacer 202, $SiO_2$ which is low loss in the terahertz wave band is arranged so as to be in contact with the semiconductor portions 201.

The distance between a first metal layer 203 and the second metal layer 204 is, as is seen from the thickness of the semiconductor portions 201, about 1 µm, and the spacer 202 is set to have the same thickness. In this example, more than 90% of a core layer 208 of the waveguide 207 is the semiconductor portions 201, and the electromagnetic wave propagates through the thin intrinsic semiconductor layer of the active layer 206 in the surface plasmon mode. In this example, if the equivalent refractive index of the waveguide 207 when the oscillation frequency is 0.3 THz is about 20, then the guide wavelength λg in the oscillation mode is 50 µm. Therefore, the size of the semiconductor portions 201 is approximately equivalent to λg/2, the pitch length is approximately equivalent to λg/2, and the size of the spacer 202 is approximately equivalent to λg/50.

A method of manufacturing a waveguide 307b of the element of this example is now described with reference to FIGS. 3I, 3II, and 3B3 to 3B6. The waveguide 307b in this example is manufactured as follows. As a first substrate, the InP substrate 309 having the multiple quantum well structure which forms the semiconductor portion 301 epitaxially grown thereon by molecular beam epitaxy or the like is prepared (FIG. 3I). As a second substrate, a GaAs substrate 305 is prepared (FIG. 3II). The semiconductor portion 301 is divided into semiconductor portions 301b, each of which is formed in an island shape, by photolithography and dry etching. $SiO_2$ is filled into the space between adjacent semiconductor portions 301b by plasma CVD and CMP to form a spacer 302b (FIG. 3B3). A Ti/Pd/Au layer (20 nm/20 nm/200 nm) is formed on the upper surface of the InP substrate 309 (surface having the semiconductor portions 301b arranged thereon) by vacuum deposition. A Ti/Pd/Au layer (20 nm/20 nm/200 nm) is formed on the upper surface of the GaAs substrate 305 by vacuum deposition. The upper surfaces of the InP substrate 309 and the GaAs substrate 305 are caused to face each other, and the substrates are bonded to each other by thermocompression bonding of Au (FIG. 3B4). The Ti/Pd/Au/Pd/Ti layer (20 nm/20 nm/400 nm/20 nm/20 nm) formed here by thermocompression bonding is the first metal layer 303. The InP substrate 309 is removed from the integral substrate by grinding and hydrochloric acid etching to transfer the semiconductor portions 301b onto the GaAs substrate 305. By photolithography and dry etching, the spacer 302b is formed (FIG. 3B5). Vacuum deposition and lift-off are used to form the second metal layer 304 of Ti/Pd/Au (20 nm/20 nm/200 nm) (FIG. 3B6).

In the element in this example, also, strain and defect caused in the semiconductor in an initial state or during operation due to the manufacturing process or the like are suppressed, and thus, an improvement in and stability of characteristics such as oscillation characteristics are realized.

Example 3

Example 3 according to the present invention is now described with reference to FIGS. 4A to 4C, 5, and 6A to 6C. Note that, in the figures, the number of the depressed and projected structures is reduced. As an active layer 406, a resonant tunnel diode structure which is the same as that in the case of Example 1 is used, and the structure of semiconductor portions 401 is also the same as that of Example 1. With regard to a waveguide 407, the length L is 1 mm which is 20 times as large as λg and the width is 0.005 mm, and a second metal layer 404 is formed in a rectangular pattern of 1 mm×0.005 mm. Description of other structures which are similar to those in the case of Example 1 is omitted.

An oscillator 400 of this example includes a region 412 in proximity to one end face of the waveguide 407, in which a semiconductor portion 401 formed in an island shape and a spacer 402 as a depressed and projected structure extending in the in-plane direction. Similarly to the case of Example 1, the spacer 402 is formed of BCB. In this example, the volume ratio between the semiconductor portion 401 and the spacer 402 in a core layer 408 of the waveguide 407 is distributed in the in-plane direction. In other words, the coarseness and fineness of the depressed and projected structure in the core layer 408 of the waveguide 407 gradually changes in proximity to the end face of the waveguide. More specifically, as shown in the table of FIG. 5, the semiconductor portion 401 and the spacer 402 are arranged so that the volume ratio of the semiconductor portion 401 gradually decreases (therefore, the volume ratio of the spacer 402 gradually increases) toward the end face with an increment of 20 µm-pitch. The length L' of the region 412 is 0.14 mm.

FIG. 5 shows the result of analysis of the correlation between the volume ratio of the spacer and the equivalent refractive index at 300 GHz using a high frequency electromagnetic field simulator (HFSS manufactured by ANSYS, Inc.) with regard to the structure of the waveguide 407 of this example. The equivalent refractive index of the electromagnetic wave which propagates through the waveguide 407 gradually changes from about 2 to 20 in relation to the volume ratio between the spacer 402 and the semiconductor portion 401. Therefore, in the structure disclosed in this example, in the region 412 in proximity to the end face of the waveguide 407, the equivalent refractive index gradually decreases toward the end face to reach to about 2, and thus, impedance matching with the outside of the waveguide can be achieved relatively easily. The outside of the waveguide as used herein refers to, for example, a free space, a transmission line, or a dielectric having a low dielectric constant.

Figure 6A:
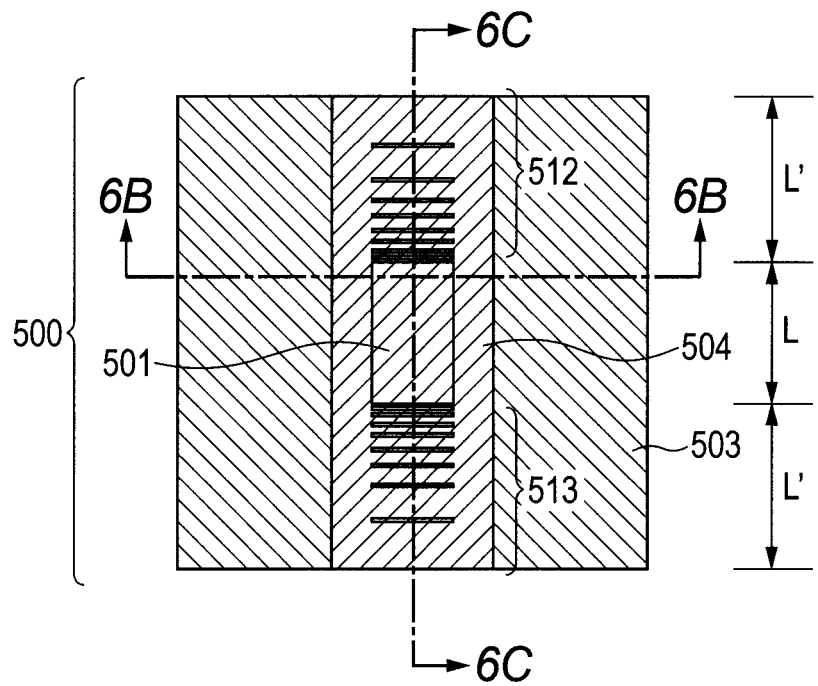
FIGS. 6A, 6B and 6C are views illustrating a modified example of the element according Example 3 of to the present invention.
Figure 6B:
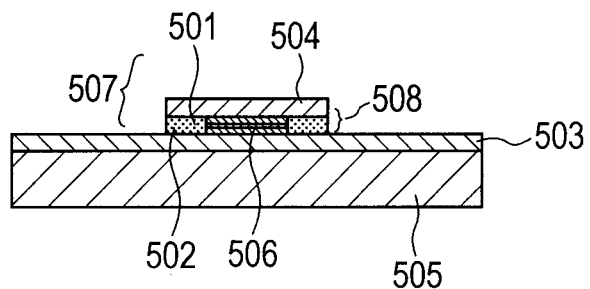
Figure 6C:
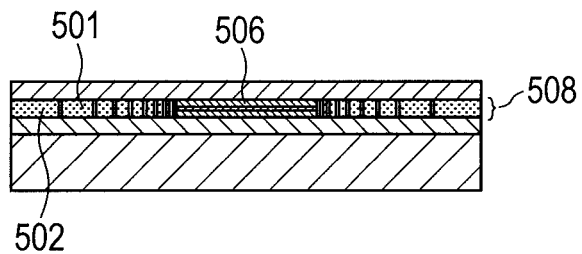

FIGS. 6A to 6C are views illustrating a waveguide 500 as a modified example of this example. Note that, in these figures, the number of the depressed and projected structures is reduced for the sake of easy understanding of the characteristics of the structure. Further, the basic structure and materials of the waveguide 500 are the same as those of the oscillator 400 illustrated in FIGS. 4A to 4C, and thus, description thereof is omitted. As in the oscillator 500, a region 512 and a region 513 in which a semiconductor portion 501 formed in an island shape and a spacer 502 to be a depressed and projected structure extending in the in-plane direction are arranged may be included in proximity to end faces on both sides of a waveguide 507. In the region 512 and the region 513 of the waveguide 507, the semiconductor portion 501 having a width of 2 µm is arranged so that the number thereof per unit length gradually decreases toward the end faces. More specifically, the semiconductor portion 501 having a width of 2 µm is arranged so that the number per 50 µm-length thereof gradually decreases to be 25, 10, 5, 2 and 1 with an increment of 50 µm-pitch. In this case, L'=250 µm. Such a structure in which the equivalent refractive index in proximity to the end faces gradually changes in this way is also suitable for impedance matching with the outside. Further, in another modified example of the present invention, the effective refractive index of the waveguide may be partially changed by partially changing the coarseness and fineness of the depressed and projected structure in the core layer 408 of the waveguide 407.

In the element of this example, also, strain or defect caused in the semiconductor in an initial state or during operation due to the manufacturing process or the like is suppressed, and thus, improvement and stability of characteristics such as oscillation characteristics are realized. Further, in a DMW, reflection at an end face increases and the beam pattern diverges due to mode mismatch between the waveguide and space, and thus, a DMW has a problem in efficient use and routing of the beam from the viewpoint of applicability. With the structure according to the present invention, a highly efficient waveguide with which impedance matching between the waveguide and the outside is easily achieved may be provided.

Figure 7:
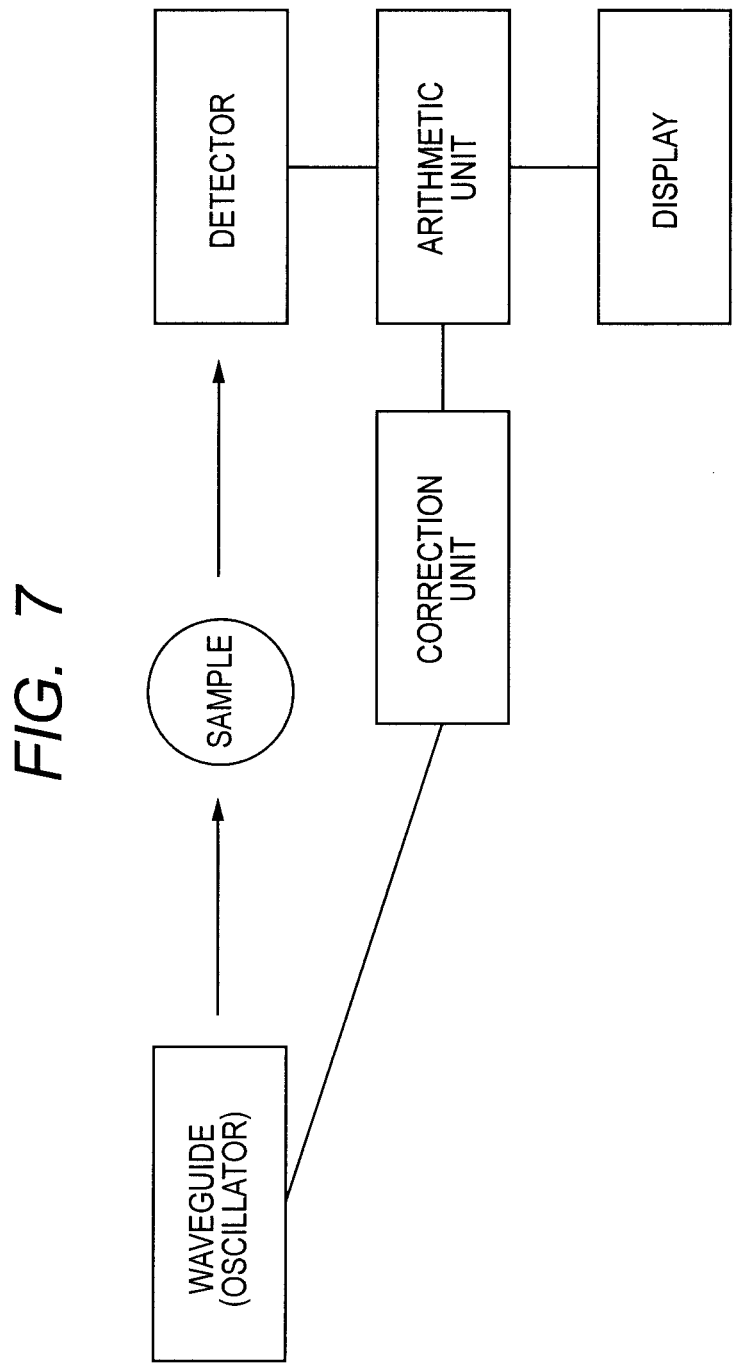
FIG. 7 is a view illustrating an application example using the element according to the embodiment and the examples of the present invention.

Further, an apparatus illustrated in FIG. 7 may be provided using the waveguide described above in combination with an arithmetic unit for calculating the state of a sample and the like. For example, the waveguide is used as an oscillator, and a sample is placed at an end of the waveguide. The sample interacts with electromagnetic wave transmitted from the waveguide, and thus, some influence is exerted on the transmitted electromagnetic wave. The electromagnetic wave applied to the sample is reflected by or passes through the sample, which is detected by a detector. After that, the arithmetic unit such as a personal computer calculates the state of the sample based on a detection signal. More specifically, application to an industrial inspection apparatus for inspecting the condition of a medicine or the like is supposed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-110887, filed May 17, 2011, which is hereby incorporated by reference herein in its entirety.

What is claimed is:

1. A waveguide, comprising:
    a first conductor layer and a second conductor layer that are composed of a negative dielectric constant medium having a negative real part of dielectric constant with respect to an electromagnetic wave in a waveguide mode; and
    a core layer that is in contact with and placed between the first conductor layer and the second conductor layer, and includes a semiconductor portion,
    wherein the core layer including the semiconductor portion has a depressed and projected structure extending in an in-plane direction, and
    wherein the depressed and projected structure includes plural projected portions arranged in a direction perpendicular to a propagation direction of the electromagnetic wave in the waveguide mode.

2. The waveguide according to claim 1, wherein the depressed and projected structure has a pitch length less than $\lambda g/2$ where $\lambda g = \lambda/n_e$, $\lambda$ is a wavelength of the electromagnetic wave, and $n_e$ is an equivalent refractive index of the waveguide.

3. The waveguide according to claim 1, wherein the depressed and projected structure has a pitch length less than 100 µm.

4. The waveguide according to claim 1, wherein depressed portions of the depressed and projected structure comprise a groove for dividing the semiconductor portion into an island shape by passing through the core layer in a thickness direction.

5. The waveguide according to claim 4, wherein the depressed portions are constituted to be a spacer of a dielectric or an insulator.

6. The waveguide according to claim 5, wherein the spacer has a width equal to or smaller than $\lambda g/2$ in a longitudinal direction and in a lateral direction of the waveguide where $\lambda g = \lambda/n_e$, $\lambda$ is a wavelength of the electromagnetic wave, and $n_e$ is an equivalent refractive index of the waveguide.

7. The waveguide according to claim 1, wherein the semiconductor portion has widths equal to or smaller than $\lambda g/2$ in a longitudinal direction and in a lateral direction of the waveguide when $\lambda g = \lambda/n_e$, where $\lambda$ is a wavelength of the electromagnetic wave, and $n_e$ is an equivalent refractive index of the waveguide.

8. The waveguide according to claim 1, wherein the semiconductor portion is arranged at least at a location which is to be an antinode in a resonance electric field in an oscillation mode.

9. The waveguide according to claim 5, wherein the spacer is arranged at least at a location which is to be a node in a resonance electric field in an oscillation mode.

10. The waveguide according to claim 1, wherein the semiconductor portion has a multiple quantum well structure for generating a terahertz wave by intersubband transition of a carrier.

11. The waveguide according to claim 1, wherein the depressed and projected structure has a coarseness and fineness that gradually changes in proximity to an end face of the waveguide.

12. An apparatus using an electromagnetic wave, comprising:
    the waveguide as defined in claim 1; and
    an arithmetic unit for detecting the electromagnetic wave which has interacted with a sample and calculating a state of the sample based on a detection signal.

13. A method of manufacturing a waveguide, wherein the waveguide is as defined in claim 1, the method comprising:
    forming a depressed portion in a semiconductor layer; and
    filling the depressed portion with a substance to arrange a spacer.

14. The method according to claim 13, the method further comprising:
    preparing a first substrate having the semiconductor layer provided on an upper surface thereof;
    preparing a second substrate;

transferring the semiconductor layer on the first substrate via the first conductor layer onto an upper surface of the second substrate; and forming the second conductor layer on an upper surface of the semiconductor layer having the spacer arranged therein.

15. A waveguide, comprising:

a first conductor layer and a second conductor layer that are composed of a negative dielectric constant medium having a negative real part of dielectric constant with respect to an electromagnetic wave in a waveguide mode; and a core layer that is in contact with and placed between the first conductor layer and the second conductor layer, and includes a semiconductor portion, wherein the core layer including the semiconductor portion has a depressed and projected structure extending in an in-plane direction, and wherein the depressed and projected structure includes plural projected portions, and a pitch or a size of the plural projected portions gradually changes toward an end face of the waveguide.

16. The waveguide according to claim 15, wherein the pitch or the size of the plural projected portions gradually decreases toward the end face.

17. The waveguide according to claim 16, wherein the pitch of the plural projected portions gradually decreases toward the end face.

18. The waveguide according to claim 16, wherein the size of the plural projected portions gradually decreases toward the end face.

* * * * *